(12) United States Patent
Sheng et al.

(10) Patent No.: US 12,507,508 B2
(45) Date of Patent: *Dec. 23, 2025

(54) MICRO LIGHT-EMITTING DIODE AND MICRO LIGHT-EMITTING DIODE ARRAY

(71) Applicant: XIAMEN SAN'AN OPTOELECTRONICS CO., LTD., Hongtang Town (CN)

(72) Inventors: Cuicui Sheng, Tianjin (CN); Chun-Kai Huang, Tianjin (CN); Chun-Yi Wu, Fujian (CN)

(73) Assignee: XIAMEN SAN'AN OPTOELECTRONICS CO., LTD., Hongtang Town (CN)

( * ) Notice: Subject to any disclaimer, the term of this patent is extended or adjusted under 35 U.S.C. 154(b) by 720 days.

This patent is subject to a terminal disclaimer.

(21) Appl. No.: 17/883,120

(22) Filed: Aug. 8, 2022

(65) Prior Publication Data
US 2022/0384688 A1 Dec. 1, 2022

Related U.S. Application Data

(63) Continuation-in-part of application No. 16/802,929, filed on Feb. 27, 2020, now Pat. No. 11,417,801, (Continued)

(30) Foreign Application Priority Data

Aug. 30, 2017 (CN) .......................... 201710763086.7

(51) Int. Cl.
*H01L 33/38* (2010.01)
*H01L 25/075* (2006.01)
(Continued)

(52) U.S. Cl.
CPC ..... *H10H 20/8312* (2025.01); *H01L 25/0753* (2013.01); *H10H 20/82* (2025.01); *H10H 20/824* (2025.01); *H10H 20/857* (2025.01)

(58) Field of Classification Search
CPC ................ H01L 33/30; H01L 33/0062; H01L 2933/0033; H01L 25/0753; H01L 33/0093;
(Continued)

(56) References Cited

U.S. PATENT DOCUMENTS 5,592,358 A * 1/1997 Shamouilian ....... H01L 21/6833
361/234
5,952,681 A * 9/1999 Chen ..................... H10H 29/14
257/E33.068
(Continued)

FOREIGN PATENT DOCUMENTS

CN 106816408 A 6/2017
CN 107681034 A 2/2018

*Primary Examiner* — Jarrett J Stark
(74) *Attorney, Agent, or Firm* — MUNCY, GEISSLER, OLDS & LOWE, P.C.

(57) ABSTRACT

A micro light-emitting diode (LED) includes an epitaxial layered structure including a support layer, a first-type semiconductor element, an active layer, and a second-type semiconductor element that are sequentially disposed on one another in such order. The micro LED is substrate-free, and the support layer has a thickness equal to or greater than 500 nm. A micro LED array is also disclosed.

20 Claims, 9 Drawing Sheets

Related U.S. Application Data which is a continuation-in-part of application No. PCT/CN2018/081667, filed on Apr. 3, 2018.

(51) Int. Cl.
  *H10H 20/82* (2025.01)
  *H10H 20/824* (2025.01)
  *H10H 20/831* (2025.01)
  *H10H 20/857* (2025.01)

(58) Field of Classification Search
  CPC . H01L 2933/0025; H01L 33/44; H01L 33/12; H01L 33/36–42; H01L 33/62; H01L 2933/0016; H01L 2933/0066; H01L 33/647
  See application file for complete search history.

(56) References Cited

U.S. PATENT DOCUMENTS

| | | | | |
|---|---|---|---|---|
| 6,583,443 B1* | 6/2003 | Chang | H10H 20/831 | 257/749 |
| 6,599,768 B1* | 7/2003 | Chen | H01L 24/97 | 438/22 |
| 6,806,112 B1* | 10/2004 | Horng | H10H 20/018 | 438/33 |
| 6,949,395 B2* | 9/2005 | Yoo | H10H 20/841 | 257/E33.068 |
| 7,067,340 B1* | 6/2006 | Tsai | H10H 20/018 | 438/47 |
| 7,205,576 B2* | 4/2007 | Song | H10H 20/835 | 257/E33.068 |
| 8,536,614 B2* | 9/2013 | Hsu | H10H 20/831 | 257/E33.001 |
| 8,652,861 B1* | 2/2014 | Kraus | H10H 20/01 | 438/46 |
| 8,835,940 B2* | 9/2014 | Hu | H10H 29/142 | 257/79 |
| 8,859,311 B2* | 10/2014 | Lee | H10H 20/857 | 438/31 |
| 8,941,215 B2* | 1/2015 | Hu | H01L 24/05 | 257/773 |
| 9,577,170 B2* | 2/2017 | Chen | H10H 20/84 | |
| 2002/0034835 A1* | 3/2002 | Chen | H10H 20/0133 | 438/29 |
| 2002/0053872 A1* | 5/2002 | Yang | H10H 20/018 | 313/499 |
| 2002/0137244 A1* | 9/2002 | Chen | H10H 20/8581 | 438/22 |
| 2002/0145147 A1* | 10/2002 | Chiou | H10H 20/814 | 257/E33.068 |
| 2003/0047737 A1* | 3/2003 | Lin | H10H 20/018 | 438/22 |
| 2004/0026708 A1* | 2/2004 | Chen | H10H 20/8585 | 257/784 |
| 2005/0017262 A1* | 1/2005 | Shei | H10H 20/841 | 257/E33.068 |
| 2005/0062049 A1* | 3/2005 | Lin | H10H 29/14 | 257/79 |
| 2006/0081857 A1* | 4/2006 | Hong | H10H 29/10 | 257/E27.12 |
| 2007/0231943 A1* | 10/2007 | Ouellet | B81C 1/00269 | 438/50 |
| 2008/0083929 A1* | 4/2008 | Fan | H10H 29/10 | 315/308 |
| 2009/0032830 A1* | 2/2009 | Li | H10H 20/018 | 257/E33.001 |
| 2009/0173963 A1* | 7/2009 | Hsu | H01L 24/82 | 257/E33.013 |
| 2009/0184334 A1* | 7/2009 | Lee | H10H 20/833 | 257/E33.068 |
| 2010/0051969 A1* | 3/2010 | Ogihara | H10H 29/14 | 257/88 |
| 2011/0089444 A1* | 4/2011 | Yao | H10H 20/833 | 257/E33.066 |
| 2012/0074379 A1* | 3/2012 | Tao | H10H 29/14 | 257/E33.012 |
| 2012/0104455 A1* | 5/2012 | Peng | H10F 77/484 | 257/E33.072 |
| 2012/0127718 A1* | 5/2012 | Kim | H05B 45/42 | 362/249.01 |
| 2012/0256187 A1* | 10/2012 | Yu | H10H 29/14 | 257/E33.056 |
| 2012/0292634 A1* | 11/2012 | Bae | H10H 20/833 | 438/46 |
| 2013/0228744 A1* | 9/2013 | Kazama | H10H 20/816 | 257/13 |
| 2014/0042470 A1* | 2/2014 | Hsu | H10H 20/01 | 257/98 |
| 2014/0312365 A1* | 10/2014 | Ishikura | H01L 25/0753 | 257/88 |
| 2015/0008389 A1* | 1/2015 | Hu | H10H 20/01 | 438/34 |
| 2015/0028362 A1* | 1/2015 | Chan | H01L 24/29 | 438/28 |
| 2015/0179876 A1* | 6/2015 | Hu | H10H 20/835 | 257/13 |
| 2015/0187740 A1* | 7/2015 | McGroddy | H01L 24/75 | 345/82 |
| 2015/0187991 A1* | 7/2015 | McGroddy | H01L 24/75 | 257/13 |
| 2016/0197232 A1* | 7/2016 | Bour | H10H 20/81 | 257/13 |
| 2017/0170049 A1* | 6/2017 | Hu | H01L 21/6835 | |
| 2017/0358706 A1* | 12/2017 | Kim | H10H 20/812 | |
| 2019/0229097 A1* | 7/2019 | Takeya | H01L 21/6835 | |
| 2020/0194624 A1* | 6/2020 | Sheng | H10H 20/013 | |
| 2020/0403114 A1* | 12/2020 | Meng | H01L 25/0753 | |
| 2021/0020807 A1* | 1/2021 | Moon | H01S 5/00 | |
| 2021/0036185 A1* | 2/2021 | Kuo | H10H 20/814 | |
| 2021/0036187 A1* | 2/2021 | Lee | H10H 20/01 | |
| 2021/0050475 A1* | 2/2021 | Tsai | H10H 20/018 | |
| 2021/0249558 A1* | 8/2021 | Tsai | H10H 20/857 | |
| 2022/0102942 A1* | 3/2022 | Yu | H01S 5/021 | |

* cited by examiner

MICRO LIGHT-EMITTING DIODE AND MICRO LIGHT-EMITTING DIODE ARRAY

CROSS-REFERENCE TO RELATED APPLICATION

This application is a continuation-in-part (CIP) application of U.S. patent application Ser. No. 16/802,929, filed on Feb. 27, 2020, which is a bypass continuation-in-part (CIP) application of PCT International Application No. PCT/CN2018/081667, filed on Apr. 3, 2018, which claims priority of Chinese Invention Patent Application No. 201710763086.7, filed on Aug. 30, 2017. The entire content of each of the U.S., International and Chinese patent applications is incorporated herein by reference.

FIELD

This disclosure relates to a micro light-emitting diode and a micro light-emitting diode array.

BACKGROUND

Micro-component technology refers to formation of an array of components on a substrate in a high-density manner. Micro devices made by the micro-component technology include, for example, microelectromechanical systems (MEMS), microswitch, light-emitting diode (LED) display systems, and MEMS-based or quartz-based crystal oscillators. Among these micro devices, micro LEDs exhibit outstanding qualities such as high luminance, low power consumption, high resolution, and high color saturation, which attract many industry players to develop methods for manufacturing micro LEDs with even better qualities.

Referring to FIG. 1, an epitaxial structure of a conventional light-emitting diode (LED) includes a substrate 101 made of gallium arsenide (GaAs), a buffer layer 102 made of GaAs, an etch-stop layer 103, an N-type ohmic contact layer 111 made of GaAs, a transition layer 112 made of gallium indium phosphide (GaInP), an N-type window layer 121 made of aluminum gallium indium phosphide (AlGaInP), an N-type cladding layer 122, an active layer 123, a P-type cladding layer 124, and a P-type window layer 125 that are disposed on the substrate 101 in such order. FIG. 2 shows a micro LED including the abovementioned epitaxial structure, where an N-type electrode 131 is formed on the N-type ohmic contact layer 111, a P-type electrode 133 is formed on the P-type window layer 125, and a carrier substrate 161 spaced apart from the epitaxial structure is connected to the P-type window layer 125 of the epitaxial structure through a supporting pillar 151. Since the N-type ohmic contact layer 111 having a thickness of less than 100 nm is relatively thin, it is more liable to fracture, causing separation of the P-type and N-type electrodes 133, 131.

SUMMARY

Therefore, an object of the disclosure is to provide a micro light-emitting diode (LED) and a micro LED array that can alleviate at least one of the drawbacks of the prior art.

According to this disclosure, the micro LED includes an epitaxial layered structure, a first electrode and a second electrode. The epitaxial layered structure includes a support layer, a first-type semiconductor element, an active layer, and a second-type semiconductor element that are sequentially disposed on one another in such order. The first electrode is disposed on a surface of the first-type semiconductor element opposite to the support layer, and is electrically connected to the first-type semiconductor element. The second electrode is disposed on a surface of the second-type semiconductor element opposite to the active layer, and is electrically connected to the second-type semiconductor element. The micro LED is substrate-free. The support layer has a thickness equal to or greater than 500 nm.

According to this disclosure, the micro LED array includes a plurality of spaced apart micro LEDs that are arranged in an array, and a lead wire that electrically connects two adjacent ones of the spaced apart micro LEDs. At least one of the spaced apart micro LEDs includes an epitaxial layered structure, a first electrode, and a second electrode. The epitaxial layered structure includes a support layer, a first-type semiconductor element, an active layer, and a second-type semiconductor element that are sequentially disposed on one another in such order. The first electrode is disposed on a surface of the first-type semiconductor element opposite to the support layer, and is electrically connected to the first-type semiconductor element. The second electrode is disposed on a surface of the second-type semiconductor element, opposite to the active layer, and is electrically connected to the second-type semiconductor element. The support layer has a thickness equal to or greater than 500 nm.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
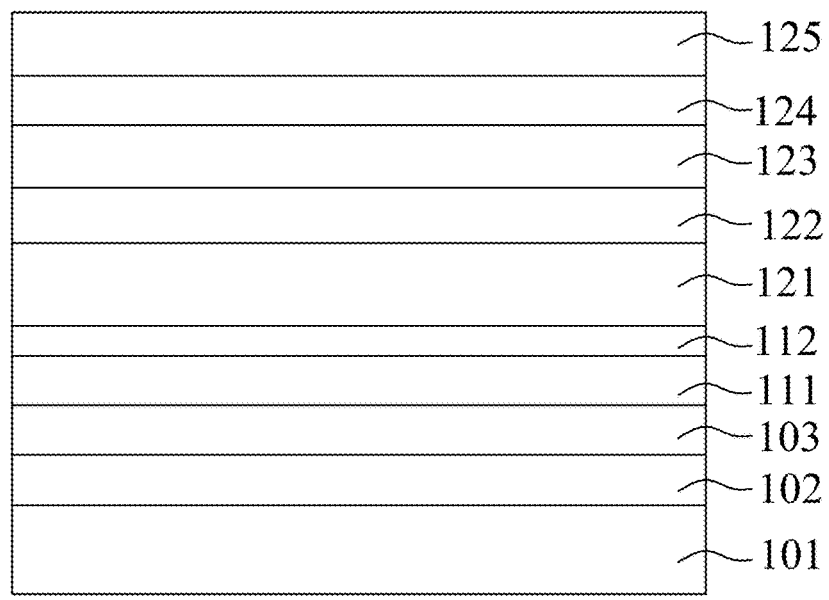
FIG. 1 is a schematic view of a conventional epitaxial structure to be made into a light-emitting diode (LED)

Before the disclosure is described in greater detail, it should be noted that where considered appropriate, reference numerals have been repeated among the figures to indicate corresponding or analogous elements, which may optionally have similar characteristics.

Further, in describing representative embodiments of the present disclosure, the method and/or process of the present disclosure may be presented as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present disclosure should not be limited to the performance of their steps in the order written, and one skilled in the art can readily appreciate that the sequences may be varied and still remain within the spirit and scope of the present disclosure.

Figure 3:
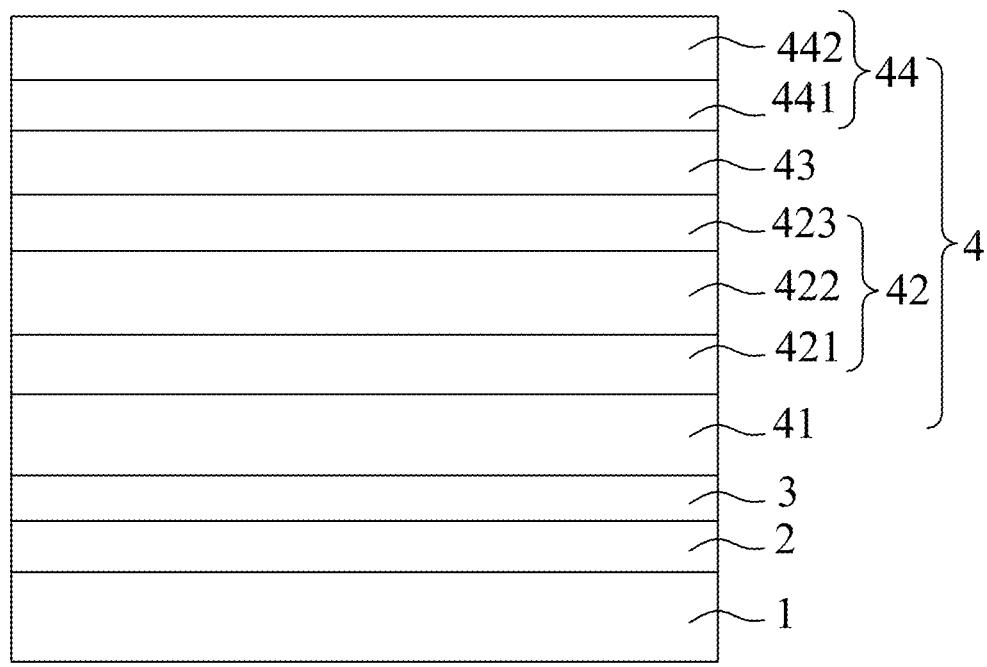
FIG. 3 is a schematic view of an epitaxial layered structure to be made into an embodiment of a LED according to the disclosure.
Figure 4:
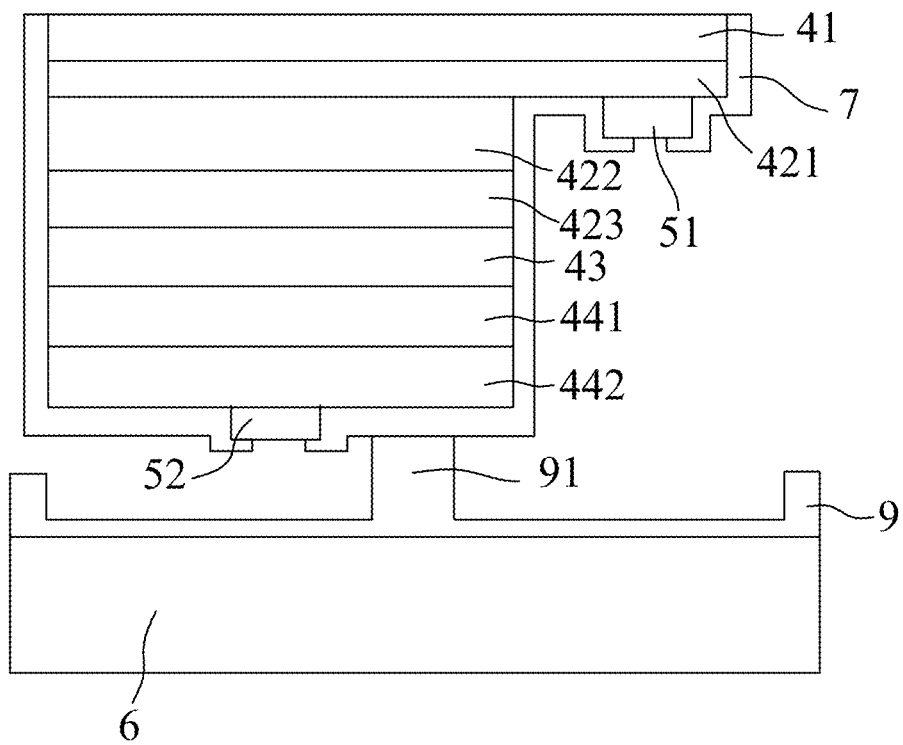
FIG. 4 is a schematic view of the embodiment of the LED including the epitaxial layered structure of FIG. 3.

Referring to FIG. 3, an epitaxial layered structure 4 formed on a growth substrate 1, is adapted to be made into an embodiment of a micro light-emitting diode (LED) according to the disclosure (see FIG. 4). The epitaxial layered structure 4 includes a support layer 41, a first-type semiconductor element 42, an active layer 43, and a second-type semiconductor element 44 that are sequentially disposed on one another in such order.

In order to facilitate better epitaxial growth and to obtain high-quality epitaxial layered structure, a buffer layer 2 may be disposed on the growth substrate 1, and a first transition layer 3 may be further disposed between the buffer layer 2 and the support layer 41 of the epitaxial layered structure 4.

In this embodiment, the growth substrate 1 is made of a gallium arsenide (GaAs)-based material, but is not limited thereto. Other materials such as gallium phosphide (GaP)-based material and indium phosphide (InP)-based material may also be used to make the growth substrate 1.

The buffer layer 2 may have a thickness ranging from 10 nm to 1000 nm and may be made of a material which is selected based on the material of the growth substrate 1 to offset the negative effect (e.g., lattice mismatch) caused by the growth substrate 1 on the epitaxial layered structure 4. In this embodiment, the buffer layer 2 is made of a GaAs-based material.

The first transition layer 3 may have a thickness ranging from 5 nm to 200 nm and may be made of a GaInP-based material to serve as a smooth transition between the buffer layer 2 made of a GaAs-based material and the support layer 41 made of a AlGaInP-based material.

In certain embodiments, an etch-stop layer may be further disposed on the buffer layer 2. For facilitating subsequent removal of the growth substrate 1 in the manufacturing process of the micro light-emitting diode (LED) of this disclosure, the etch-stop layer may have a thickness of not greater than 500 nm (e.g., not greater than 200 nm).

As used herein, the term "first-type" refers to being doped with a first conductivity type dopant, and the term "second-type" refers to being doped with a second conductivity type dopant that is opposite in conductivity type to the first conductivity type dopant. For instance, the first conductivity type dopant may be an N-type dopant, and the second conductivity type dopant may be a P-type dopant, and vice versa.

In this embodiment, the first-type semiconductor element 42 is an N-type semiconductor element for providing electrons, and the second-type semiconductor element 44 is a P-type semiconductor element for providing holes.

The first-type semiconductor element 42 may include a first-type ohmic contact layer 421 adapted for forming an ohmic contact with an electrode (such as n-type electrode), a first-type window layer 422 for improving current spreading in the epitaxial layered structure 4, and a first-type cladding layer 423 disposed between the first-type window layer 422 and the active layer 43 for providing electrons.

The second-type semiconductor element 44 may include a second-type cladding layer 441 disposed on the active layer 43 for providing holes, and a second-type window layer 442 disposed on the second-type cladding layer 441 for improving current spreading.

The first-type ohmic contact layer 421 of the first-type semiconductor element 42 is disposed on the support layer 41, and may be made of a GaAs-based material. In order to reduce light absorbance, the first-type ohmic contact layer 421 may have a thickness of less than 50 nm (e.g., 5 nm to 20 nm).

The first-type window layer 422 is disposed on the first-type ohmic contact layer 421 oppositely of the support layer 41, and may be made of aluminum gallium indium phosphide (AlGaInP) having a structural formula of $(Al_yGa_{(1-y)})_{0.5}In_{0.5}P$, where y is not less than 0.5 and less than 1. In certain embodiment, y ranges from 0.6 to 0.8. In this embodiment, y is 0.6. The current spreading effect of the first-type window layer 422 depends on its thickness, and on a size of the micro LED to be made, which usually ranges from 1 μm to 5000 μm. In certain embodiment, the thickness of the first-type window layer 422 is controlled to be not greater than 5 μm. For example, for manufacturing the micro LED having a size of not less than 500 μm, the first-type window layer 422 may have a thickness ranging from 500 nm to 1000 nm. Alternatively, the first-type window layer 422 may even be omitted for manufacturing the micro LED that has a size less than 100 μm and without the need of current spreading.

The support layer 41 is formed on the first-type ohmic contact layer 421, and may have a sufficient thickness to provide required strength and support for the first-type semiconductor element 42 and to protect the first-type ohmic contact layer 421 from fracture during the subsequent manufacturing process of the micro LED. For example, the support layer 41 may have a thickness of not less than 500 nm. In certain embodiments, the support layer 41 has a thickness of not less than 1 μm (e.g., 2 μm). In addition, due to the relatively great thickness, it is desirable for the support layer 41 to have a lattice constant that matches with that of the active layer 43. In an example of the micro LED emitting red light, the active layer 43 is usually made of AlGaInP, and the support layer 41 is also made of a similar material, i.e., having a structural formula of $Al_xGa_{(1-x)}InP$, where x is greater than 0 and not greater than 1. That is, the support layer 41 may be made of AlGaInP-based material or aluminum indium phosphide (AlInP)-based material. In certain embodiments, for the structural formula of $Al_xGa_{(1-x)}InP$ of the support layer 41, X is in a range of 0.15 to 1 (i.e., $0.15 \leq x \leq 1$) by taking into account light absorbance thereof. For example, x may be equal to 0.6, i.e., the support layer 4 is made of $Al_{0.6}Ga_{0.4}InP$.

The active layer 43 is formed between the first-type cladding layer 423 and the second-type cladding layer 441, and may include a multiple quantum well (MQW) structure where the electrons and the holes undergo radiative recombination to emit light. The MQW structure includes multiple layer pairs (e.g., 2 to 50 layer pairs), each of which includes a potential barrier layer and a potential well layer. The potential barrier layers and the potential well layers in the MQW structure are alternately-stacked. Each of the potential barrier layers is made of $Al_{a1}Ga_{(1-a1)}InP$, and each of the potential well layers is made of $Al_{a2}Ga_{(1-a2)}InP$, wherein a1 is greater than a2.

It should be noted that the materials of the first-type cladding layer 423 and the second-type cladding layer 441 may be selected based on a band gap of the active layer 43. In certain embodiments, when the active layer 43 is designed to emit light having a wavelength of not less than 670 nm, the active layer 43 has a relatively small band gap, and therefore each of the first-type cladding layer 423 and the second-type cladding layer 441 may be made of a material having a relatively small band gap, such as aluminum gallium arsenide (AlGaAs) and AlGaInP. In certain embodiments, when the active layer 43 is designed to emit light having a wavelength lower than 670 nm (especially not greater than 640 nm), the active layer 43 has a relatively large band gap (generally over 1.9 eV), and therefore each of the first-type cladding layer 423 and the second-type cladding layer 441 may be made of a material having a relatively large band gap, such as AlInP-based material having a structural formula of $Al_bIn_{(1-b)}P$, wherein $0<b\leq0.5$. Among the AlInP-based materials, $Al_{0.5}In_{0.5}P$ (i.e., b=0.5) has the highest band gap. Therefore, in this embodiment, both of the first-type cladding layer 423 and the second-type cladding layer 441 are made of $Al_{0.5}In_{0.5}P$, so as to maximize a difference in band gap between the active layer 43 and the second-type cladding layer 441 to block heat generated from the active layer 43 due to leakage of electrons. In addition, the first-type cladding layer 423 may be doped with the N-type dopant (such as Si). The second-type cladding layer 441 may be doped with the P-type dopant (such as Mg).

In certain embodiments, the epitaxial layered structure 4 further includes an undoped blocking layer that is made of materials such as AlInP and AlGaInP and that is formed above and/or below the active layer 43, so as to prevent the N-type dopant in the first-type semiconductor element 42 and the P-type dopant in the second-type semiconductor element 44 from spreading into and adversely affecting the active layer 43. The undoped blocking layer may have a thickness of not greater than 1000 nm. In certain embodiments, a first undoped blocking layer may be formed between the active layer 43 and the first-type cladding layer 423 to block Si in the first-type cladding layer 423 from spreading into the active layer 43, and a second undoped blocking layer may be formed between the active layer 43 and the second-type cladding layer 441 to block Mg in the second-type cladding layer 441 from spreading into the active layer 43.

The second-type window layer 442 may be made of a GaP-based material and may have a thickness ranging from 500 nm to 5000 nm (such as 1.2 μm). The second-type cladding layer 441 may have a thickness ranging from 50 nm to 5000 nm.

In certain embodiments, the epitaxial layered structure 4 further includes a second transition layer that is made of a AlGaInP-based material and that is formed between the second-type window layer 442 and the second-type cladding layer 441 to compensate for the large lattice constant difference between GaP and AlInP. The second transition layer may have a thickness ranging from 3 nm to 100 nm. In addition, the content of the first transition layer may be gradually changed to allow a smooth transition from GaP to AlInP, thereby improving lattice quality of the second-type window layer 442.

It should be noted that, the above materials of the epitaxial layered structure 4 are given as an example for making a micro LED emitting red light. In certain embodiments, the micro LED may be made of materials such as indium gallium nitride (InGaN), gallium nitride (GaN), GaP, AlGaInP, and aluminum gallium phosphide (AlGaP) to emit green light (e.g., having a wavelength ranging from 495 nm to 570 nm). In other embodiments, the micro LED may be made of materials such as GaN, InGaN, and zinc selenide (ZnSe) to emit blue light (e.g., having a wavelength ranging from 450 nm to 495 nm).

Referring to FIG. 4, the embodiment of the micro LED of the disclosure includes the above mentioned epitaxial layered structure 4 as shown in FIG. 3, a first electrode 51, and a second electrode 52. The micro LED further includes a carrier substrate 6 (e.g., transfer substrate) and a securing layer 9 for assisting transfer of the micro LED to, for example, but not limited to, a circuit board, and a thin-film transistor (TFT) panel, in subsequent process.

The first electrode 51 is disposed on a surface of the first-type semiconductor element 42 opposite to the support layer 41 and is electrically connected to the first-type semiconductor element 42. The second electrode 52 is disposed on a surface of the second-type semiconductor element 44 opposite to the active layer 43, and is electrically connected to the second-type semiconductor element 44. In this embodiment, the first electrode 51 is an N-type electrode disposed on an exposed surface of the first-type ohmic contact layer 421 that is formed through etching, and the second electrode 52 is a P-type electrode disposed on the second-type window layer 442.

The carrier substrate 6 is spaced apart from the epitaxial layered structure 4. The securing layer 9 is formed with at least one pillar 91 and is disposed on the carrier substrate 6 to connect the epitaxial layered structure 4 to the carrier substrate 6 through the at least one pillar 91. Since the majority of a surface of the epitaxial layered structure 4 facing the carrier substrate 6 does not connect to the at least one pillar 91, the securing layer 9 provides a structure from which the micro LED may be easily picked up. That is, after being transferred to the circuit board or the TFT panel, the carrier substrate 6 and the securing layer 9 are separated from the micro LED by applying force to break the pillar 91. The securing layer 9 and the at least one pillar 91 may be made of a thermosetting material, such as benzocyclobutene (BCB) or epoxy, but is not limited thereto.

In this embodiment, the first electrode 51, the second electrode 52, and the at least one pillar 91 of the securing layer 9 are disposed on the same side relative to the support layer 41, which allows the micro LED to emit light from an opposite side. This arrangement not only increases a light emitting area of the micro LED, but also provides convenience for packaging of the micro LED. In addition, the support layer 41 may impart strength to the first-type ohmic contact layer 421, so as to prevent the first-type ohmic contact layer 421 from fracture, thereby avoiding disconnection of the first electrode 51 and the second electrode 52.

As shown in FIG. 4, in this embodiment, the micro LED does not include the growth substrate 1, the buffer layer 2, and the first transition layer 3 as shown in FIG. 3, which are removed by, e.g., wet etching during the manufacturing process of the micro LED. A portion of the support layer 41 may also be removed such that the support layer 41 has a roughened surface on a light emitting side of the micro LED, i.e., opposite to the first-type semiconductor element 42. The etching thickness of the support layer 41 may range from 0.1 μm to 0.2 μm so as to maintain a support strength thereof while enhancing an intensity of light emitted from the micro LED. Therefore, the micro LED of the present disclosure may be substrate-free. That is, the micro LED does not include the growth substrate 1 and the carrier substrate 6 as an element of the micro LED.

In this embodiment, the micro LED further includes an insulating protective layer 7 that is formed on and covers the epitaxial layered structure 4 such that the first and second electrodes 51, 52 are exposed from the insulating protective layer 7. The insulating protective layer 7 may have a thickness greater than 1 μm, and may be made of a material such as $SiN_x$ or $SiO_2$, but is not limited thereto.

Figure 13:
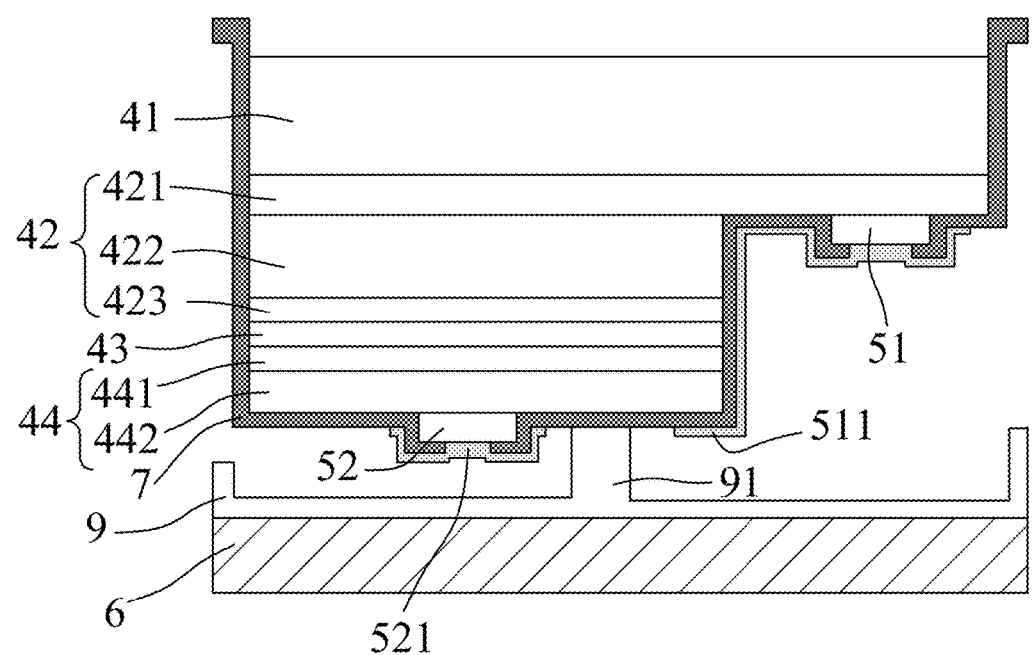

The micro LED may further include a first extension electrode 511 and a second extension electrode 521 (see FIG. 13). The first extension electrode 511 is electrically connected to the first electrode 51 and extends away from the first electrode 51 toward the second-type semiconductor element 44 along the insulating protective layer 7. The second extension electrode 521 is electrically connected to the second electrode 52 and extends away from the second electrode 521 along the insulating protective layer 7. In certain embodiments, the first extension electrode 511 is flush with the second extension electrode 521.

According to this disclosure, a method for manufacturing a micro LED device including at least one micro LED as mentioned above is disclosed. The method includes at least the following steps a) and b).

Figure 5:
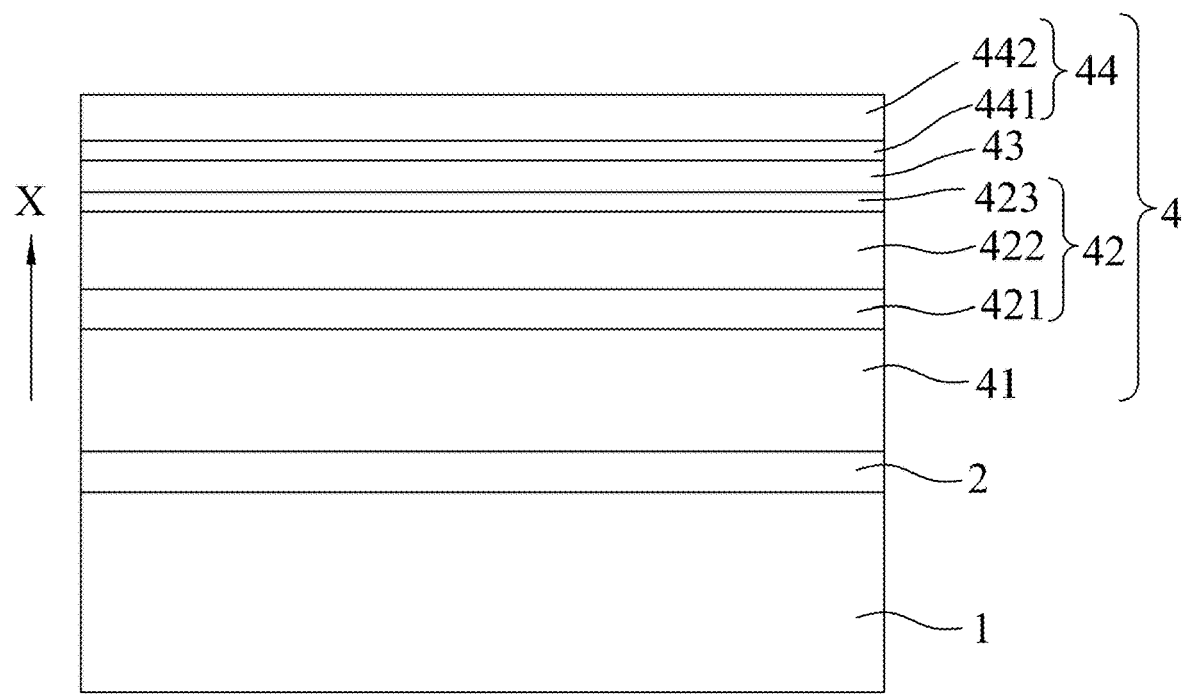
FIGS. 5 to 13 are schematic views illustrating consecutive steps of a method for manufacturing a micro LED device including at least one LED of this disclosure.

In step a), the epitaxial layered structure 4, which includes the support layer 41, the first-type semiconductor element 42, the active layer 43, and the second-type semiconductor element 44 that are sequentially disposed on one another in such order along a laminating direction (X), is formed (see FIG. 5).

Figure 7:
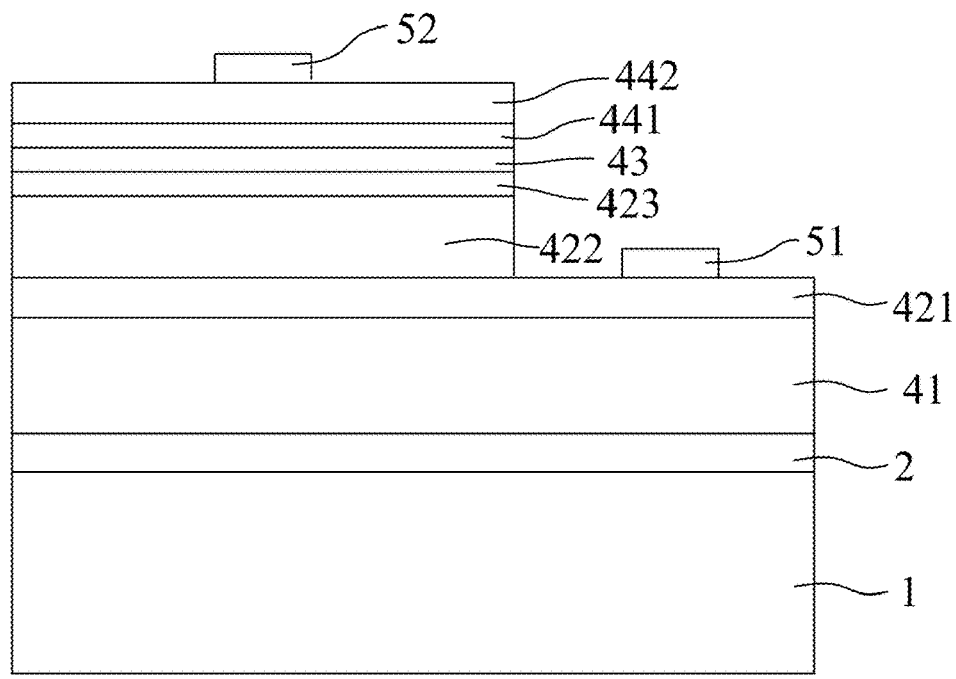

In step b), the first electrode 51 is formed on the first-type semiconductor element 42 opposite to the support layer 41, and the second electrode 52 is formed on the second-type semiconductor element 44 opposite to the active layer 43 (see FIG. 7).

An embodiment of the method for manufacturing the micro LED device that includes a plurality of the micro LEDs, is described below in detail with reference to FIGS. 5 to 13.

To be specific, referring to FIG. 5, in step a), the epitaxial layered structure 4 is formed on a growth substrate 1, and the buffer layer 2 may be further disposed between the epitaxial layered structure 4 and the growth substrate 1. The first-type (N-type) semiconductor element 42 may include the first-type ohmic contact layer 421 disposed on the support layer 41, the first-type window layer 422 disposed on the first-type ohmic contact layer 421, and the first-type cladding layer 423 disposed on the first-type window layer 422. The second-type (P-type) semiconductor element 44 includes the second-type cladding layer 441 disposed on the active layer 43, and the second-type window layer 442 disposed on the second-type cladding layer 441. A plurality of spaced apart micro LED regions (A) that are arranged in an array and a cutting region (B) that surrounds and separates the micro LED regions (A) are defined on the epitaxial layered structure 4 (see FIGS. 6 and 14). That is, the epitaxial layered structure 4 is divided into a plurality of micro units that respectively correspond in position to the micro LED regions (A). Each of the micro units includes a portion of the epitaxial layered structure 4, i.e., a portion of the support layer 41, a portion of the first-type semiconductor element 42, a portion of the active layer 43, and a portion of the second-type semiconductor layer 44.

Figure 6:
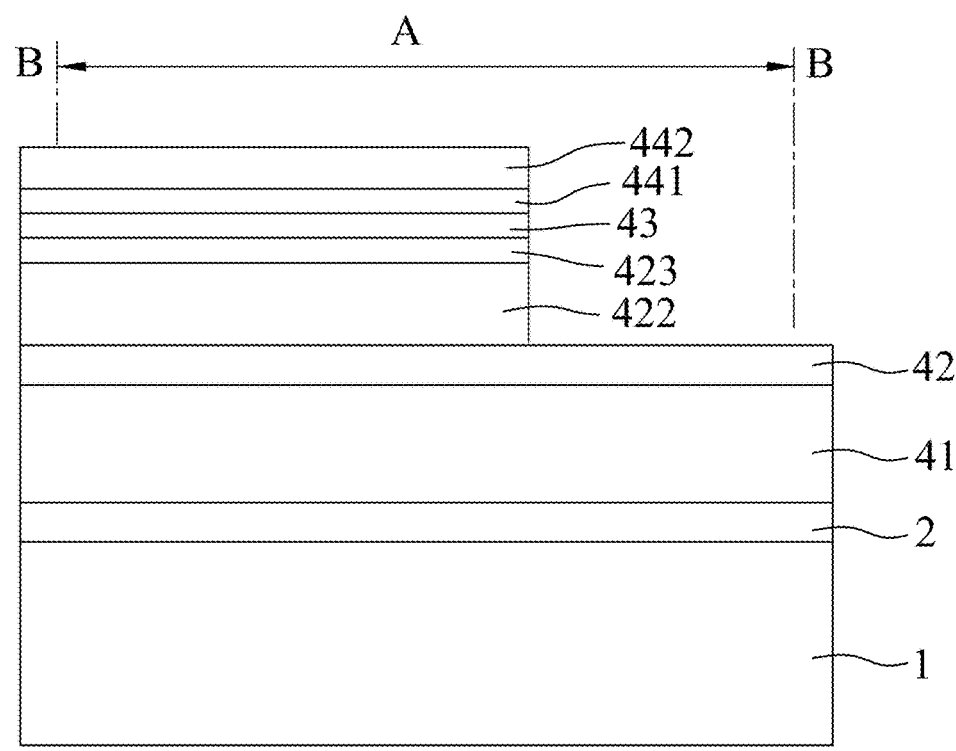

Referring to FIG. 6, the method further includes before step b), step d) of etching a portion of the second-type semiconductor element 44 and a portion of the active layer 43 to expose the first-type semiconductor element 42. Specifically, on each of the micro LED regions (A), a portion of the second-type semiconductor element 44, a portion of the active layer 43, a portion of the first-type semiconductor element 42 (including the first-type cladding layer 423 and the first-type window layer 422) are removed by dry etching, and then etch residue of the first-type window layer 422 are further removed by wet etching to expose a surface of the first-type ohmic contact layer 421.

Afterwards, in step b), the first electrode 51 and the second electrode 52 are formed on and electrically connected to the exposed surface of the first-type ohmic contact layer 421 and the second-type window layer 442, respectively, e.g., by virtue of a welding process (see FIG. 7). The first and second electrodes 51, 52 may be made of a material such as Au/AuZn/Au.

Figure 8:
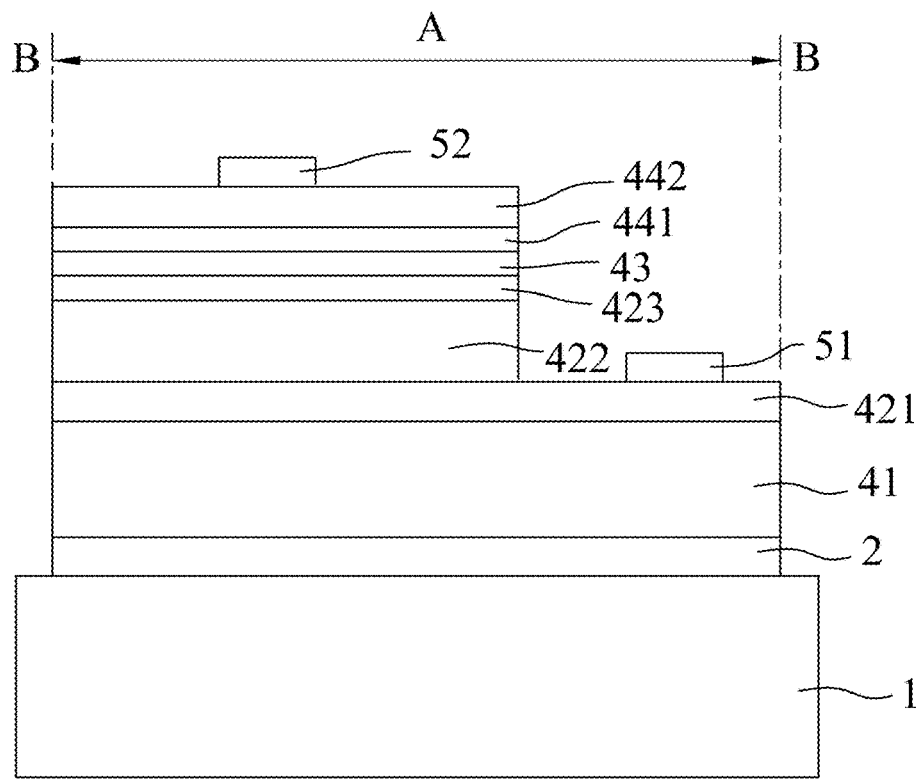

Referring to FIG. 8, after steps b) and d), the method further includes, step h) of etching, in the cutting region (B), the second-type semiconductor element 44, the active layer 43, the first-type semiconductor element 42, and the support layer 4 until the growth substrate 1 is exposed. As such, the micro units are spaced apart from one another.

Figure 9:
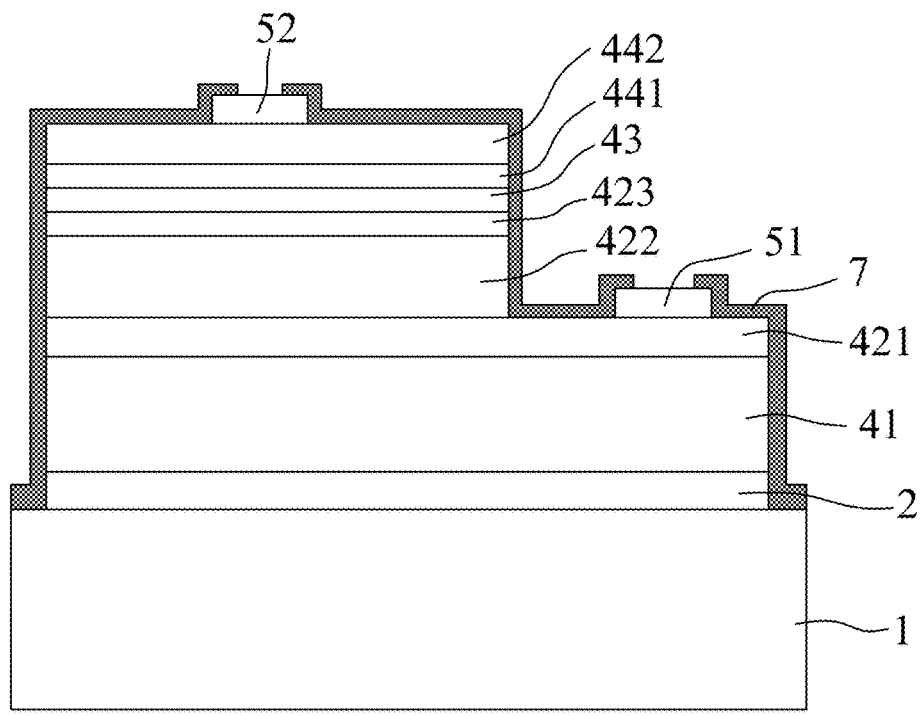

Referring to FIG. 9, after step d), the method further includes, step e) of forming the insulating protective layer 7 on the epitaxial layered structure 4 to cover the epitaxial layered structure 4 and to expose the first and second electrodes 51, 52. Specifically, the insulating protective layer 7 is formed on each of the micro units, and only a portion of the first electrodes 51 and a portion of the second electrode 52 are exposed.

Figure 10:
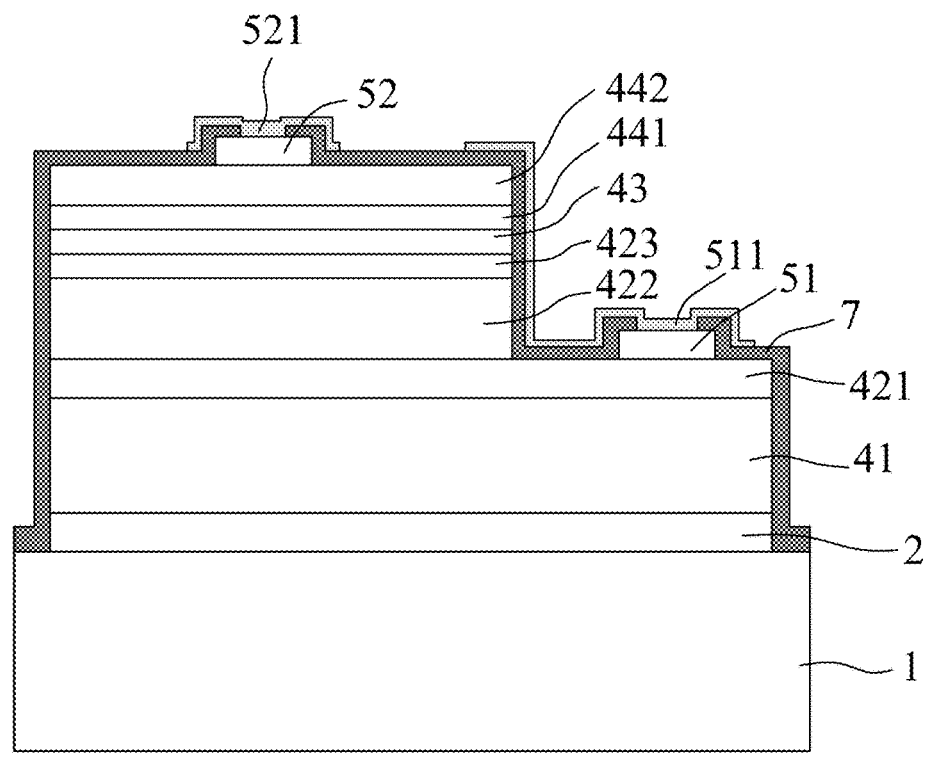

Referring to FIG. 10, the method further includes after step e), step f) of forming the first extension electrode 511 that is electrically connected to the first electrode 51 and that extends away from the first electrode 51 toward the second-type semiconductor element 44 along the insulating protective layer 7, and forming the second extension electrode 521 that is electrically connected to the second electrode 52 and that extends away from the second electrode 52 along the insulating protective layer 7.

Figure 11:
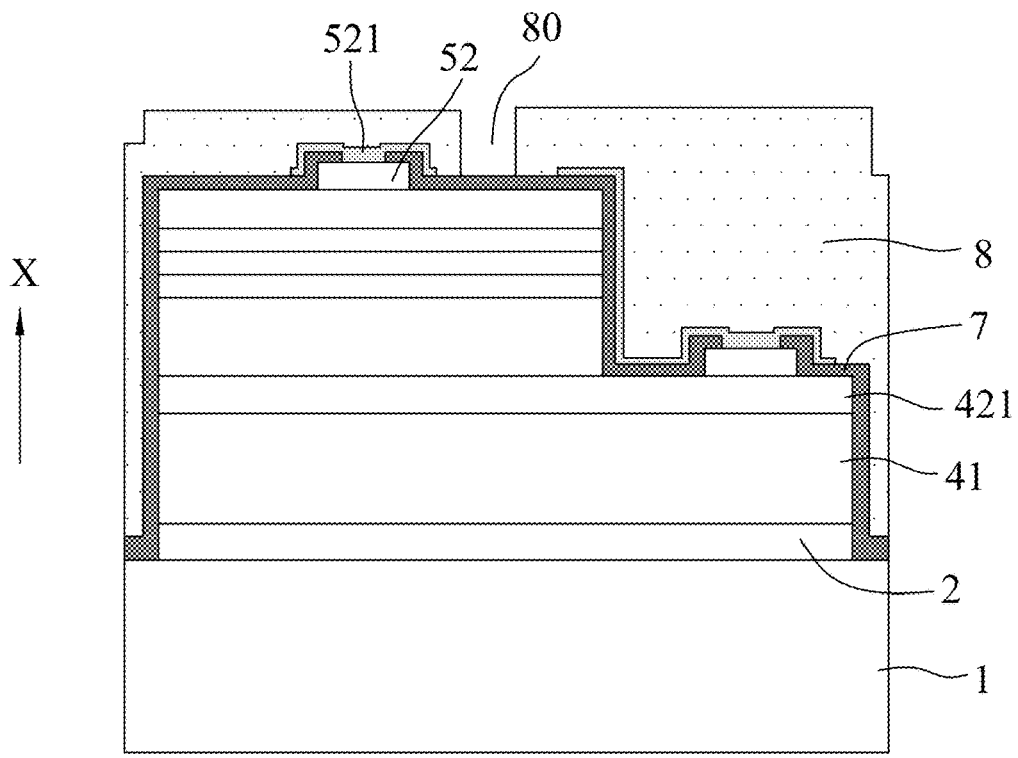

Referring to FIG. 11, the method further includes after step f), step g) of forming a sacrificial layer on the epitaxial layered structure 4 in the laminating direction (X). The sacrificial layer 8 has at least one through-hole 80 in the laminating direction (X) to expose the epitaxial layered structure 4. In this embodiment, on each of the micro LED regions (A), the sacrificial layer covers the insulating protective layer 7 and the micro units. The sacrificial layer 8 may have a thickness ranging from 0.1 μm to 5 μm and may be made of an oxide, a nitride or another material, which can be selectively removed from the micro units while the other layers are retained. For example, the sacrificial layer 8 is made of titanium (Ti) and has a thickness ranging from 2 μm to 4 μm.

Figure 12:
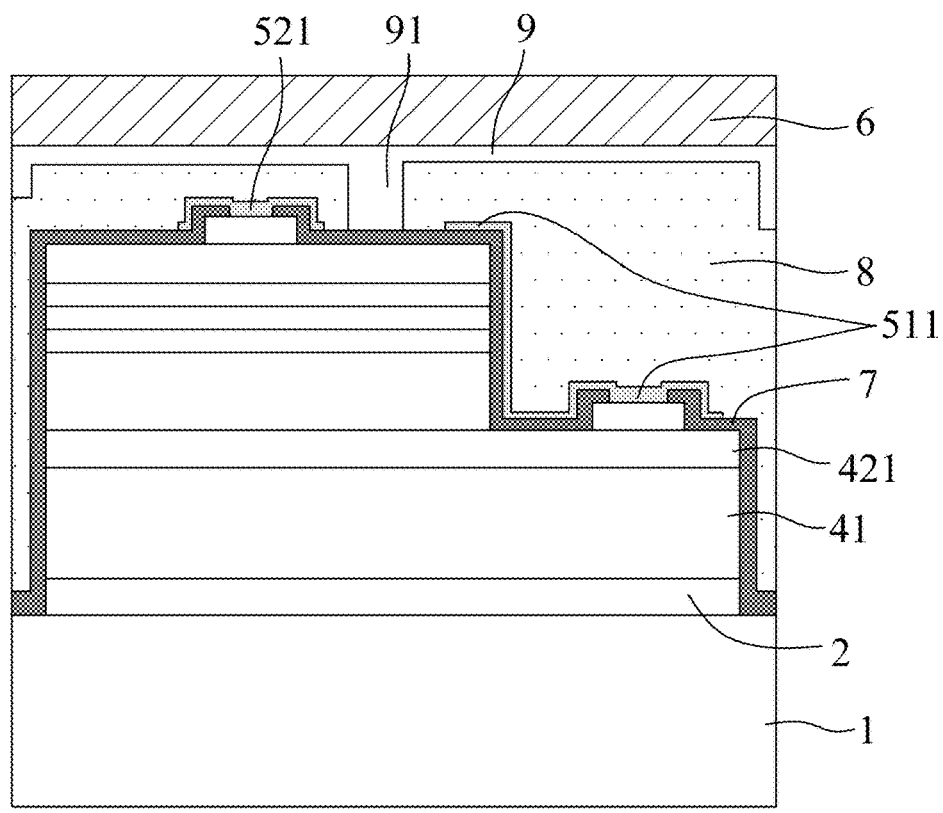

Referring to FIG. 12, the method further includes after step g), step c) of providing the carrier substrate 6 that is spaced apart from the epitaxial layered structure 4 in the laminating direction (X), and forming the securing layer 9 between the epitaxial layered structure 4 and the carrier substrate 6. The securing layer 9 has the at least one pillar 91 to connect the epitaxial layered structure 4 to the carrier substrate 6. To be specific, in this embodiment, on each of the micro LED regions (A), the securing layer 9 is formed between the carrier substrate 6 and the sacrificial layer 8 and fills the at least one through-hole 80 of the sacrificial layer 8 to form the at least one pillar 91.

Referring to FIG. 13, the method further includes after step c), a step of removing the growth substrate 1 and the buffer layer 2 to expose the support layer 41. Removal of the growth substrate 1 depends on the material thereof, and may be performed using, for example, laser lift off (LLO), grinding, and etching, but are not limited thereto. In certain embodiments, in which the growth substrate 1 is made of GaAs and the etch-stop layer is disposed between the growth substrate 1 and the support layer 41, the removal of the growth substrate 1 is performed by etching or a combination of grinding and selective etching in cooperation with the etch-stop layer. Then, the epitaxial structure 100 is flipped over and the sacrificial layer 8 is removed, thereby obtaining the micro LEDs.

Figure 14:
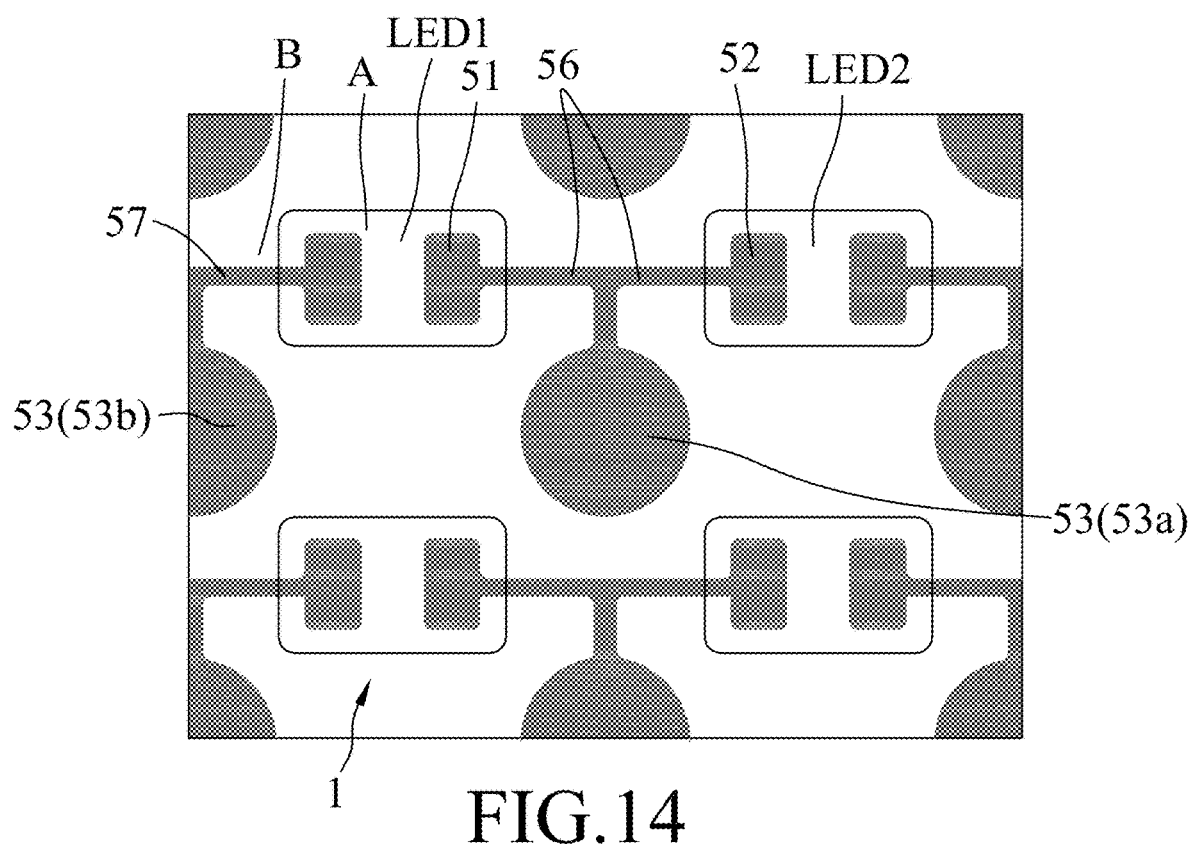
FIG. 14 is a schematic top view illustrating a pattern of test electrodes formed to determine the quality of the thus manufactured LED device.

In some embodiments, the method further includes, after removal of the growth substrate 1, a step of transferring the obtained micro LEDs to a predetermined element, e.g., a circuit board, a thin-film transistor (TFT) panel by applying a force to break the pillar 91, such that the carrier substrate and the securing layer 9 are disconnected and separated from the micro LEDs. As such, the micro LEDs are substrate-free. Since the N-type and P-type electrodes of each of the micro LEDs usually have miniature sizes (approximately 10 μm), in order to accurately determine the quality of the micro LEDs manufactured by the method of this disclosure, the method may further include, after step h), step i) of forming at least one test electrode 53, which is configured to measure electrical parameters of the micro LEDs, on the exposed growth substrate 1 corresponding in position to the cutting region (B) and electrically connecting the first electrode 51 of one of the micro LEDs and the second electrode 52 of another one of the micro LEDs to the test electrode 53 (see FIGS. 14 and 15). As shown in FIG. 14, in this embodiment, multiple test electrodes 53 are formed between adjacent two micro LEDs, and each of the test electrodes 53 is composed of two hemispherical guide electrodes that respectively electrically connect the first electrode 51 of one (LED 1) of two adjacent micro LEDs and the second electrode 52 of the other one (LED 2) of two adjacent micro LEDs.

Figure 15:
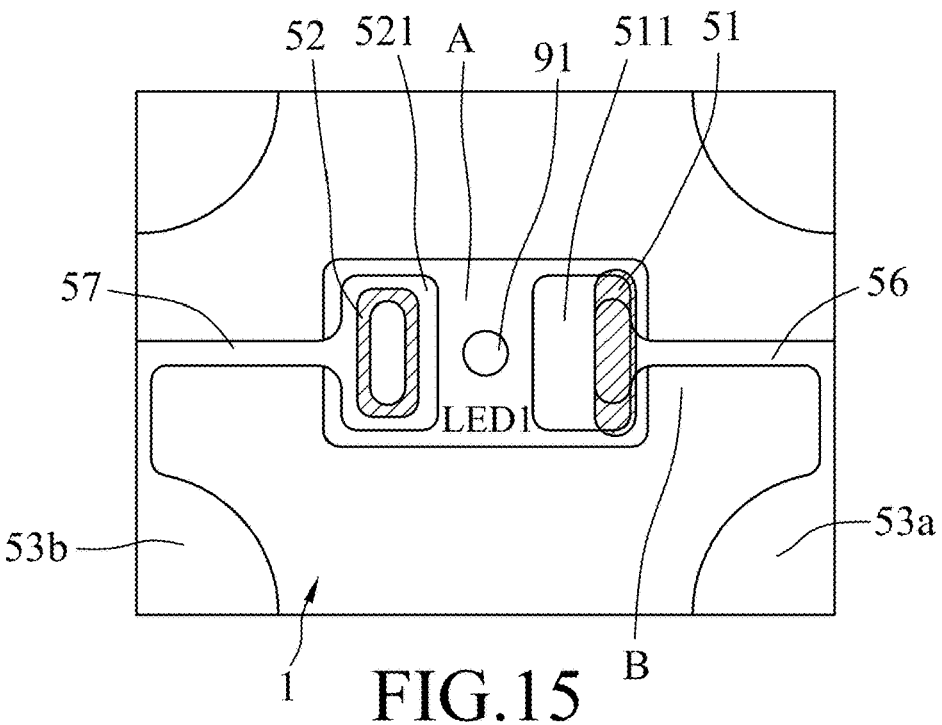
FIG. 15 is a partially enlarged schematic view of FIG. 14.

To be specific, further referring to FIG. 15, the first electrode 51 of the LED 1 is extended through the first extension electrode 511 away from the first-type ohmic contact layer 421 toward, for example, the surface of the second-type window layer 442 opposite to the active layer 43. Similarly, the second electrode 52 of the LED 2 is extended through the second extension electrode 521 (not shown). Then, a lead wire 56 electrically connected to the first extension electrode 511 and the second extension electrode 521, leads the first and second extension electrode 511 to the exposed growth substrate 1 to form a test electrode 53a. Similarly, another test electrode 53b may be formed to connect the second extension electrode 521 of LED1 and the first extension electrode 511 of another adjacent micro LED through a lead wire 57. The test electrodes 53a, 53b may be made during the formation of the first and second extension electrodes 511, 521 (i.e., step f), so that the electrical parameters of the micro LEDs may be measured at the same time. After the measurements, as the growth substrate 1 is removed, the lead wires 56, 57 become disconnected from the test electrodes 53a, 53b, so the test electrodes 53a, 53b may be easily separated from the micro LEDs.

The size of the test electrode 53, which is usually 100 μm, may be varied depending on a width of the exposed growth substrate 1 corresponding in position to the cutting region (B) (i.e., the distance between adjacent two micro LEDs). In addition, the projection of the guide electrodes which forms the test electrode 53 on the growth substrate 1 may have a shape such as triangular, rectangular, etc.), which may be varied according to practical requirements. For example, the guide electrodes 53a may have a quarter-sphere shape, and four adjacent guide electrodes 53a from the P-type/N-type electrodes of the micro LEDs may form one of the test electrodes 53 to measure the electrical parameters of the micro LEDs.

In addition, not all of the micro LEDs in the micro LED device have to be subjected to electrical parameters measurement using the test electrodes 53. That is, the distribution of the test electrodes 53 may be adjusted according to practical requirements. If a micro LED device has relatively consistent electrical and optical parameters among the micro LEDs, only a few selected regions on the micro LED device (e.g., four corners of the micro LED device) are formed with the test electrodes 53 to determine the electrical parameters of the micro LEDs on these selected regions, so as to ascertain the electrical parameters of the whole micro LED device.

Figure 16:
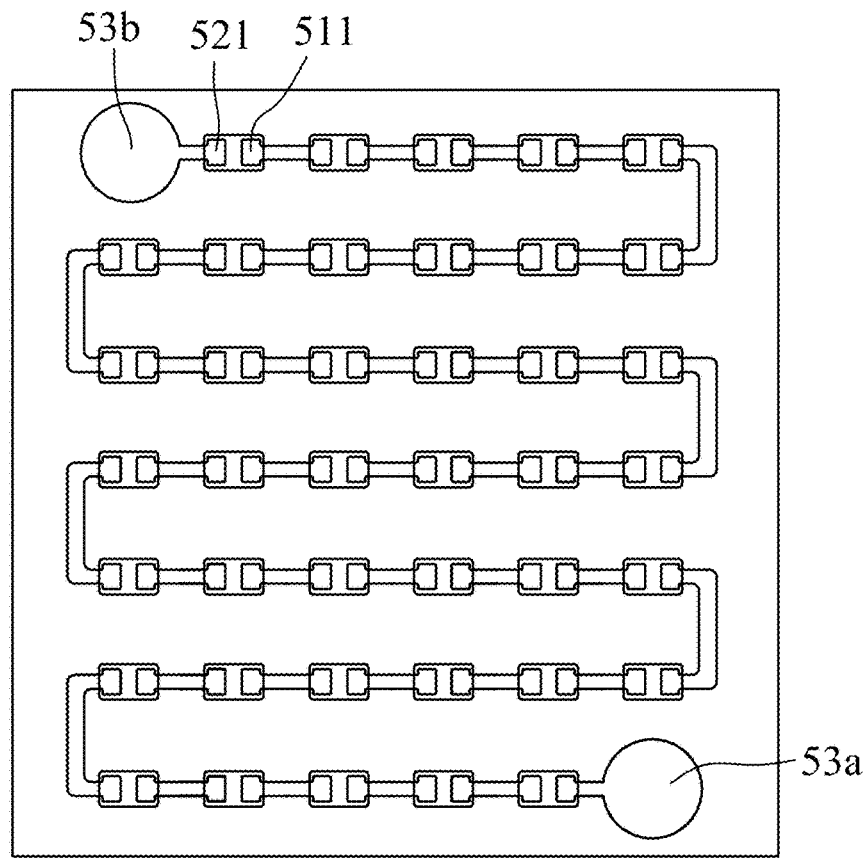
FIGS. 16 and 17 are schematic views illustrating different patterns of the test electrodes for the LED device.
Figure 17:
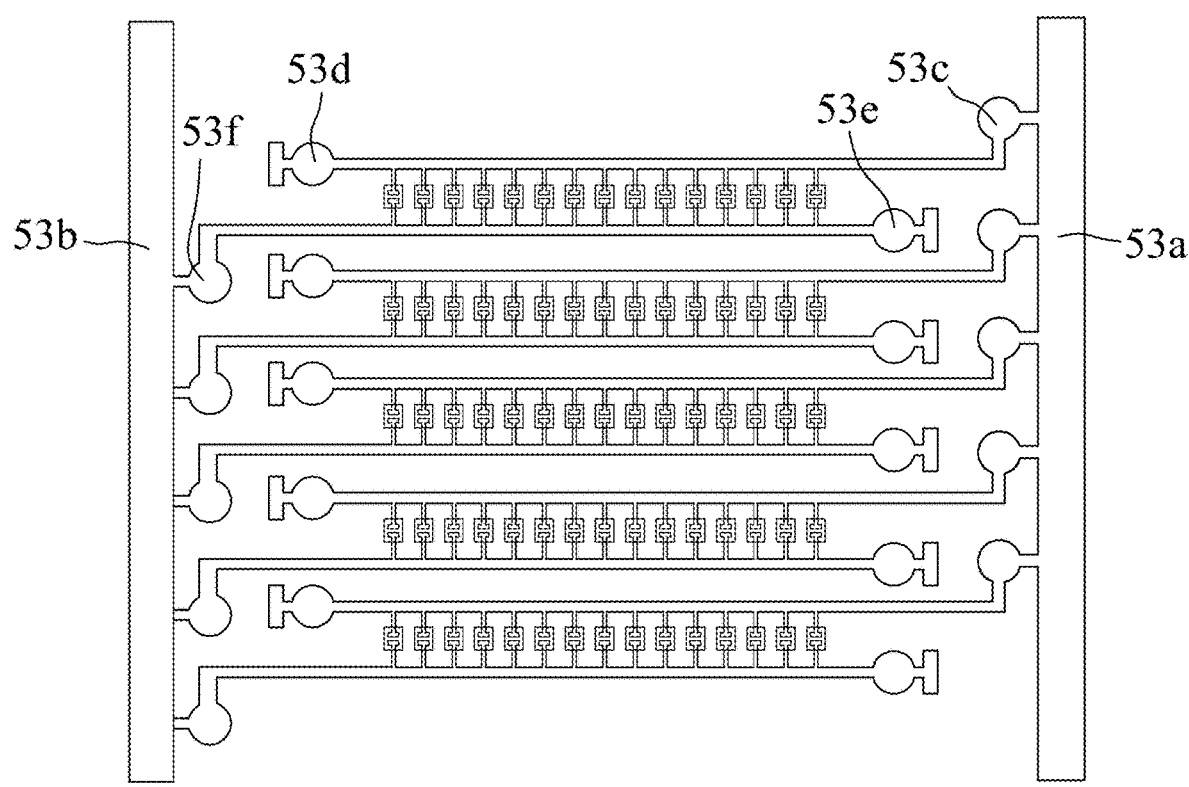

In certain embodiments, the micro LEDs of the micro LED device may be connected in tandem or in parallel for measuring the electrical parameters using the test electrodes 53. Referring to FIG. 16, 40 micro LEDs are connected in tandem, and two test electrodes 53a, 53b are connected to the first and the last ones of the micro LEDs. Referring to FIG. 17, 75 micro LEDs are connected in parallel, and two test electrodes 53a, 53b in a strip form are connected to the P-type/N-type electrodes of each of the micro LEDs. A series of alternative test electrodes (53c to 53f) may be further formed in case of the two test electrodes 53a, 53b may be damaged.

Figure 2:
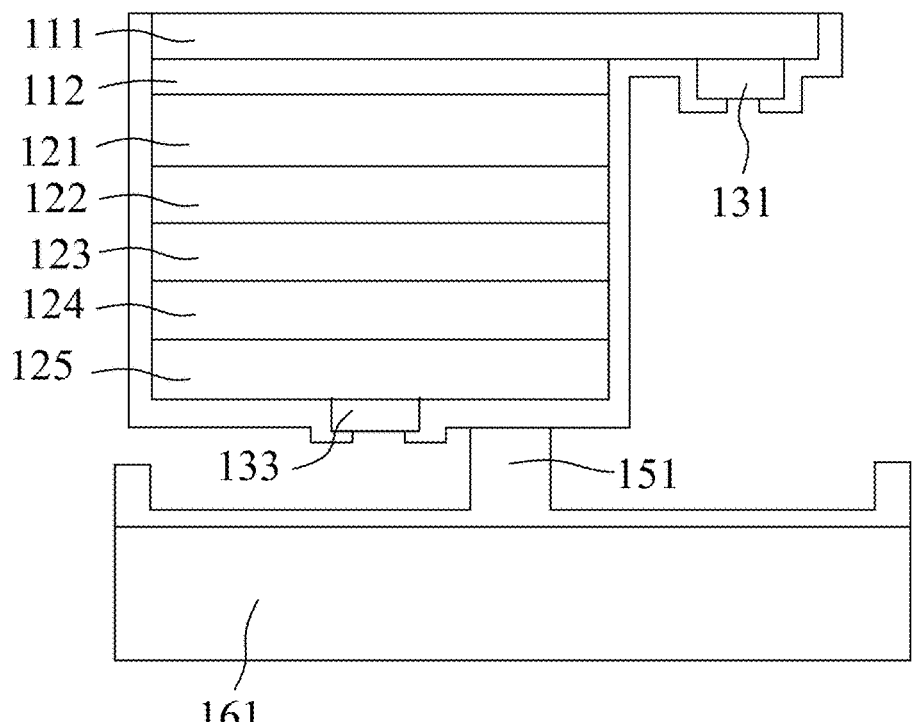
FIG. 2 is a schematic view of a conventional light-emitting diode (LED) including the conventional epitaxial structure of FIG. 1.

It should be noted that, forming the test electrode 53 to measure the electrical parameters of the micro LEDs are not limited to what is disclosed herein, i.e., may also be applied to micro LEDs having a structure as shown in FIG. 3 or 5 (i.e., micro LEDs having the support layer 41), and any micro LED having the P/N electrodes and the carrier substrate on the same side (e.g., the structure as shown in FIG. 2).

In sum, by inclusion of the support layer 41 in the micro LED of the disclosure, the first-type semiconductor element 42 is provided with support and strength to prevent fracture thereof. In addition, since the P and N electrodes are formed on a same side of the carrier substrate 6, light is emitted from an opposite side, which improves luminance of the micro LED and provides convenience for packaging thereof.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A micro light-emitting diode, comprising:
   an epitaxial layered structure including a support layer, a first-type semiconductor element, an active layer, and a second-type semiconductor element that are sequentially disposed on one another in such order;
   a first electrode that is disposed on a surface of said first-type semiconductor element opposite to said support layer and that is electrically connected to said first-type semiconductor element; and
   a second electrode that is disposed on a surface of said second-type semiconductor element opposite to said active layer and that is electrically connected to said second-type semiconductor element;
   wherein said micro light-emitting diode is substrate-free, and said support layer has a thickness equal to or greater than 500 nm; and
   wherein said support layer has a lattice constant that matches with a lattice constant of said active layer.

2. The micro light-emitting diode according to claim 1, further comprising an insulating protective layer that is formed on and covers said epitaxial layered structure, such that said first and second electrodes are exposed from said insulating protective layer.

3. The micro light-emitting diode according to claim 2, further comprising:
   a first extension electrode that is electrically connected to said first electrode and that extends away from said first electrode toward said second-type semiconductor element along said insulating protective layer; and
   a second extension electrode that is electrically connected to said second electrode and that extends away from said second electrode along said insulating protective layer.

4. The micro light-emitting diode according to claim 1, wherein said support layer has a roughened surface that is opposite to said first-type semiconductor element.

5. The micro light-emitting diode according to claim 1, wherein said support layer is made of AlGaInP with a structural formula of $Al_xGa_{(1-x)}InP$, wherein x is greater than 0.

6. The micro light-emitting diode according to claim 5, wherein x is in a range of $0.15 \leq x \leq 1$.

7. The micro light-emitting diode according to claim 1, wherein said first-type semiconductor element includes an ohmic contact layer that is disposed on said support layer.

8. The micro light-emitting diode according to claim 7, wherein said ohmic contact layer has a thickness equal to or less than 100 nm.

9. The micro light-emitting diode according to claim 7, wherein said first-type semiconductor element further includes a window layer that is made of AlGaInP, and that is disposed on said ohmic contact layer oppositely of said support layer.

10. The micro light-emitting diode according to claim 9, wherein the AlGaInP for making said window layer has a structural formula of $(Al_yGa_{(1-y)})_{0.5}In_{0.5}P$, y being not less than 0.5 and less than 1.

11. The micro light-emitting diode according to claim 10, wherein y ranges from 0.6 to 0.8.

12. The micro light-emitting diode according to claim 1, wherein said first and second electrodes are formed on a same side of said epitaxial layered structure.

13. The micro light-emitting diode according to claim 1, wherein said second-type semiconductor element includes a cladding layer that is made of a AlInP-based material, and a window layer that is made of a GaP-based material and that is disposed on said cladding layer.

14. The micro light-emitting diode according to claim 13, wherein the AlInP-based material for making said cladding layer has a structural formula of $Al_bIn_{(1-b)}P$, wherein $0 < b \leq 0.5$.

15. A micro light-emitting diode array, comprising:
   a plurality of spaced apart micro light-emitting diodes that are arranged in an array, at least one of said spaced apart micro light-emitting diodes including:
      an epitaxial layered structure including a support layer, a first-type semiconductor element, an active layer, and a second-type semiconductor element that are sequentially disposed on one another in such order;
      a first electrode that is disposed on a surface of said first-type semiconductor element opposite to said support layer and that is electrically connected to said first-type semiconductor element; and
      a second electrode that is disposed on a surface of said second-type semiconductor element opposite to said active layer, and that is electrically connected to said second-type semiconductor element;
      wherein said support layer has a thickness equal to or greater than 500 nm; and
   a wire that electrically connects two adjacent ones of said spaced apart micro light-emitting diodes,
   wherein said support layer has a lattice constant that matches with a lattice constant of said active layer.

16. The micro light-emitting diode array according to claim 15, further comprising a test electrode that is electrically connected to said two adjacent ones of said spaced apart micro light-emitting diodes through said lead wire.

17. The micro light-emitting diode array according to claim 16, wherein said spaced apart micro light-emitting diodes are connected in tandem.

18. The micro light-emitting diode array according to claim 16, wherein said spaced apart micro light-emitting diodes are connected in parallel.

19. The micro light-emitting diode according to claim 7, wherein said first-type semiconductor element further includes
   a window layer disposed on said ohmic contact layer opposite to said support layer, and
   a cladding layer disposed between said window layer and said active layer.

20. The micro light-emitting diode according to claim 19, wherein said ohmic contact layer is directly connected to said support layer, and
   wherein said first electrode is directly formed on a surface of said ohmic contact layer that is opposite to said support layer and that is exposed from said window layer.

* * * * *